US006411224B1

(12) United States Patent
Wilson et al.

(10) Patent No.: US 6,411,224 B1
(45) Date of Patent: Jun. 25, 2002

(54) TRELLIS CODES FOR TRANSITION JITTER NOISE

(75) Inventors: Bruce A. Wilson, Stanford; Shan X. Wang, Menlo Park, both of CA (US)

(73) Assignee: The Board of Trustees of the Leland Stanford Junior University, Palo Alto, CA (US)

(*) Notice: Subject to any disclaimer, the term of this patent is extended or adjusted under 35 U.S.C. 154(b) by 0 days.

(21) Appl. No.: 09/497,827

(22) Filed: Feb. 3, 2000

(51) Int. Cl.$^7$ .................................................. H03M 7/00
(52) U.S. Cl. ........................................ 341/59; 714/792
(58) Field of Search .............................. 341/50, 58, 59; 714/792

(56) References Cited

U.S. PATENT DOCUMENTS

| | | | | |
|---|---|---|---|---|
| 4,483,012 | A | 11/1984 | Wei .............................. | 375/27 |
| 4,888,775 | A | 12/1989 | Karabed et al. ............... | 371/43 |
| 5,233,629 | A | 8/1993 | Paik et al. ..................... | 375/39 |
| 5,563,864 | A | * 10/1996 | Kobayashi et al. ............ | 369/59 |
| 6,233,213 | B1 | * 5/2001 | Okada et al. .................. | 369/59 |
| 6,241,778 | B1 | * 6/2001 | de Lind van Wijngaarden et al. ............................ | 341/58 |

OTHER PUBLICATIONS

Gottfried Ungerboeck, "Trellis–Coded Modulation with Redundant Signal Sets Part 1: Introduction," Feb. 1987, IEEE Communications Magazine, vol. 25, No. 2.
Wolf et al., "Trellis Coding for Partial–Response Channels," Aug. 1986, IEEE Transactions On Communications, vol. Com–34, No. 8.
Karabed et al., "Matched Spectral–Null Codes for Partial–Response Channels," May 1991, IEEE Transactions On Information Theory, vol. 37, No. 3.
Tarnopolsky et al., "Media noise and signal–to–noise ratio estimates for high areal density recording," Apr. 15, 1997, J. Appl. Phys. 81(8).
Slutsky et al., "Transition Noise Analysis of Thin Film Magnetic Recording Media," Sep. 1994, IEEE Transactions On Magnetics, vol. 30, No. 5.
Marcus et al., "Finite–State Modulation Codes for Data Storage," Jan. 1992, IEEE Journal On Selected Areas In Communications, vol. 10, No. 1.
Mignon Belongie, Ph.D., "Runlength Codes Based On Variable Length Graphs," Jan. 1992, Cornell University.
Chris Heegard, "Trellis Codes For Recording," 1988, IEEE Military Communications Conference.

* cited by examiner

*Primary Examiner*—Peguy JeanPierre
(74) *Attorney, Agent, or Firm*—Beyer Weaver & Thomas, LLP

(57) ABSTRACT

The signaling used in saturation magnetic recording is described as pulse width modulation ("PWM"). A continuous range of magnet lengths are defined between a minimum length (the smallest magnet length that can be written) and a maximum length (the longest magnet that can be read without losing clock synchronization). The recorded magnets are then partitioned into cosets according to the position of the last transition in the magnet. A finite state convolutional encoder can be used to constrain the sequence of magnet cosets. Instead of using these variable length symbols, however, the code is expressed in terms of a synchronous PAM channel, in which two consecutive transitions define a magnet. Using this expression, the code constraint on transition position is an equivalent constraint on magnet length. An appropriate encoder is created to encode the constrained code. A Viterbi detector, which reflects the code constraints, has states which are the product of the channel states of a conventional PRML detector and the encoder states. Because of the constraints, only a small subset of all branches are permitted at each resulting trellis update. A conventional sliding block decoder can be used to decode the data. In this way, a complete coded recording system can be constructed using standard building blocks of existing PRML channels, namely, a finite state encoder, a Viterbi detector and a sliding block decoder.

40 Claims, 12 Drawing Sheets

$d \le$ #0's between consecutive 1's $\le k$. ⟋ 302

$d$: to reduce intersymbol interference $k$: to prevent loss of clock synchronization

EXAMPLES:

$(d, k) = (0, 1)$:

(Sample string: 10110111101010110)

$(d, k) = (2, 7)$:

(Sample string: 1001000010000000010010000001)

| v | states | branches | ACS | ACS/bit |
|---|--------|----------|-----|---------|
| 3 | 4      | 8        | 4   | 4       |
| 4 | 8      | 16       | 8   | 8       |
| 5 | 16     | 32       | 16  | 16      |
| 6 | 32     | 64       | 32  | 32      |
| 7 | 64     | 128      | 64  | 64      |
| 8 | 128    | 256      | 128 | 128     |

Uncoded

| v | states | branches | ACS | ACS/bit |
|---|--------|----------|-----|---------|
| 3 | 12     | 16       | 4   | 8       |
| 4 | 16     | 22       | 6   | 12      |
| 5 | 22     | 30       | 8   | 16      |
| 6 | 30     | 41       | 11  | 22      |
| 7 | 41     | 56       | 15  | 30      |
| 8 | 56     | 76       | 20  | 40      |

Coded

TRELLIS CODES FOR TRANSITION JITTER NOISE

CROSS-REFERENCE TO RELATED CASES

None.

BACKGROUND OF THE INVENTION

The present invention relates to apparatus and methods for encoding information to reduce the probability of errors in the transmission and/or recording (storage) of the information. More specifically, the present invention relates to the use of coset partitioning and trellis codes to reduce the probability that transition jitter will cause one allowed sequence to be decoded as another allowed sequence. While not limited as such, the present invention has particular application to magnetic recording.

There are many applications where a sender communicates to a receiver over a noisy channel. Often, some sequences are more likely to be corrupted by noise than other sequences. On the other hand, it is desirable to allow the sender to transmit completely arbitrary messages. This dilemma is solved by encoding arbitrary messages into constrained messages that are well-adapted to the channel. A constrained encoder and its complementary constrained decoder together constitute a constrained code.

A specific application where constrained codes are needed is that of data storage. Data being recorded on a storage medium (to be retrieved by a user at some later time) can be regarded as a noisy communication channel, where recording is viewed as "sending" and retrieval (or "read back") is viewed as "receiving." This applies to virtually all current and proposed recording technologies: magnetic, optical. magneto-optical, holographic, etc.

In magnetic recording, various sources of noise can corrupt accurate information (for example, thermal noise, interference, and media noise arising from sources such as jitter, DC erase noise and pulse width/height modulation). Media noise is the dominant source of noise in many current recording systems. Media noise is usually treated as highly correlated non-stationary noise added to the read-back signal. "Transition jitter" is the dominant component of media noise and affects the position of transitions. As shown in FIG. 1, media granularity and micromagnetic interactions in magnetic recording media 101 can produce irregular transitions, thus shifting an average transition position 102 from its nominal transition position 104. The resulting transition jitter 106 can be treated as a stationary additive disturbance to transition position. In uncoded recording, if a transition point shifts by more than one half bit cell, then an error will occur.

As seen in FIG. 2, in some magnetic recordings, digitalization of the recorded data (magnetic track 202) can be portrayed in a non return to zero inverted ("NRZI") mode 204—a '1' can be recorded (that is, "sent") as a change in magnetic polarity, and a '0' recorded ("sent") as the absence of a change in magnetic polarity. For retrieval of the information (detection 206), 1's are detected by magnetic flux, but 0's are detected indirectly: the number of 0's in between two 1's is inferred by information provided by a clock. To prevent loss of clock synchronization, it is desirable that strings of consecutive 0's not be too long. To prevent intersymbol interference (that is, interference between two consecutive 1's), it is also desirable that strings of consecutive 0's not be too short. To reduce the chance of these types of errors, messages can be recorded that satisfy a run-length-limited (RLL) constraint 302, an example of which is shown in FIG. 3.

Alternatively, the length of a string of pulses can be portrayed as binary 1's or 0s which represent magnetization orientations. Such a non return to zero ("NRZ") portrayal provides another time related sequencing of the recorded data.

This requires the construction of an encoder which encodes arbitrary binary sequences into sequences that obey a specific RLL constraint. It is important that the encoder encode data at a high rate, that the decoder not propagate channel errors, and that the complexity of encoding and decoding be low.

Using the non return to zero ("NRZ") method of digitalizing recorded data, a method analogous to the NRZI method, the signaling scheme used in saturation magnetic recording can be characterized as pulse amplitude modulation (PAM). The PAM channel has a constellation of two symbols, corresponding to a single bit cell magnetized in either the up-track or down-track direction. As illustrated in FIG. 4, the recording media is divided into a series of "bit cells" 402. The symbol value is recorded as the magnetization state of each bit cell 402. Consequently, each bit cell 402 is either a +M magnetization bit cell 404 (corresponding to a binary "0") or a −M magnetization bit cell 406 (corresponding to a binary "1"). There are compelling physical reasons to restrict the signaling to saturation recording. However, the PAM symbol system has only two symbols, which traditionally has restricted the available encoding schemes. As discussed in more detail below a two symbol constellation has generally precluded traditional application of a trellis coded modulation scheme.

Earlier systems have attempted to use various schemes to enhance the effectiveness of their codes. For example, others have developed codes corresponding to a partition of the channel constellation into two cosets. This appears to have markedly reduced the effectiveness of the codes used. See, for example, C. Heegard, "Trellis codes for recording," in Proc. IEEE Mil. Comm. Conf., 1988; and M. Belongie, "Runlength codes based on variable length graphs.," Ph.D. thesis, Cornell University, January 1992; both of which are incorporated herein by reference.

Trellis coded modulation (TCM) have been attempted as well. TCM schemes combine the functions of modulation and coding by mapping user data onto a constrained sequence of symbols. TCM schemes are a vital component of many communications systems. However, there is no straightforward way to apply TCM (as proposed in earlier systems—see, for example, G. Ungerboeck, "Trellis-coded modulation with redundant signal sets," IEEE Commun. Mag., vol. 25. no. 2, pp. 5–11 1987; incorporated herein by reference in its entirety) to a PAM scheme where the constellation is restricted to just two symbols. Other TCM schemes for magnetic recording have been proposed. These include Wolf-Ungerboeck codes and matched spectral null (MSN) codes. See, for example; J. K. Wolf and G. Ungerboeck, "Trellis codes for partial response channels," IEEE Trans. Commun., vol. 34, no. 8 1986; and R. Karabed and P. H. Siegel. "Matched spectral null codes for partial-response channels," IEEE Trans. Inform. Theory, vol. 37, no. 3 1991; both incorporated herein by reference. These schemes use a state machine to constrain sequences of transmitted symbols. However, they take an approach which is rather different from classical TCM.

A code which ensures that one allowed sequence cannot be mapped to another by a small (mean-squared) shift of the positions of the written transitions should improve immunity to transition jitter. Moreover, the use of a code in which cosets are defined by their spatial or temporal relationship rather than their relationship in amplitude and/or phase would prove a significant advancement in the art.

SUMMARY OF THE INVENTION

The present invention is an encoding method and apparatus which allows data to be transmitted more reliably on certain communications and/or recording channels, especially channels where the communications medium can only support a set of discrete states, including data storage on magnetic and optical media. The invention involves the application of established methods of trellis coded modulation to communications systems where the medium can support only a small number of states and thus the channel alphabet is restricted.

The signaling used in saturation magnetic recording can be described as pulse width modulation ("PWM"). A continuous range of magnet lengths are defined between a minimum length (the smallest magnet length that can be written) and a maximum length (the longest magnet that can be read without losing clock synchronization). The recorded magnets are then partitioned into cosets according to the position of the last transition in each magnet. A finite state convolutional encoder can be used to constrain the sequence of magnet cosets.

Instead of using these variable length symbols, however, the code is expressed in terms of a synchronous PAM channel, in which two consecutive transitions define a magnet. Using this expression, the code constraint on transition position is an equivalent constraint on magnet length. An appropriate encoder is created to map user data to a constrained sequence. A Viterbi detector, which reflects the code constraints, has states which are the product of the channel states of a conventional PRML detector and the states of the constraint graph. Because of the constraints, only a small subset of all branches are permitted at each resulting trellis update. A conventional sliding block decoder can be used to map the detected data back to user data. In this way, a complete coded recording system can be constructed using standard building blocks of existing PRML channels, namely, a finite state encoder, a Viterbi detector and a sliding block decoder.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF PREFERRED EMBODIMENTS

Figure 1:
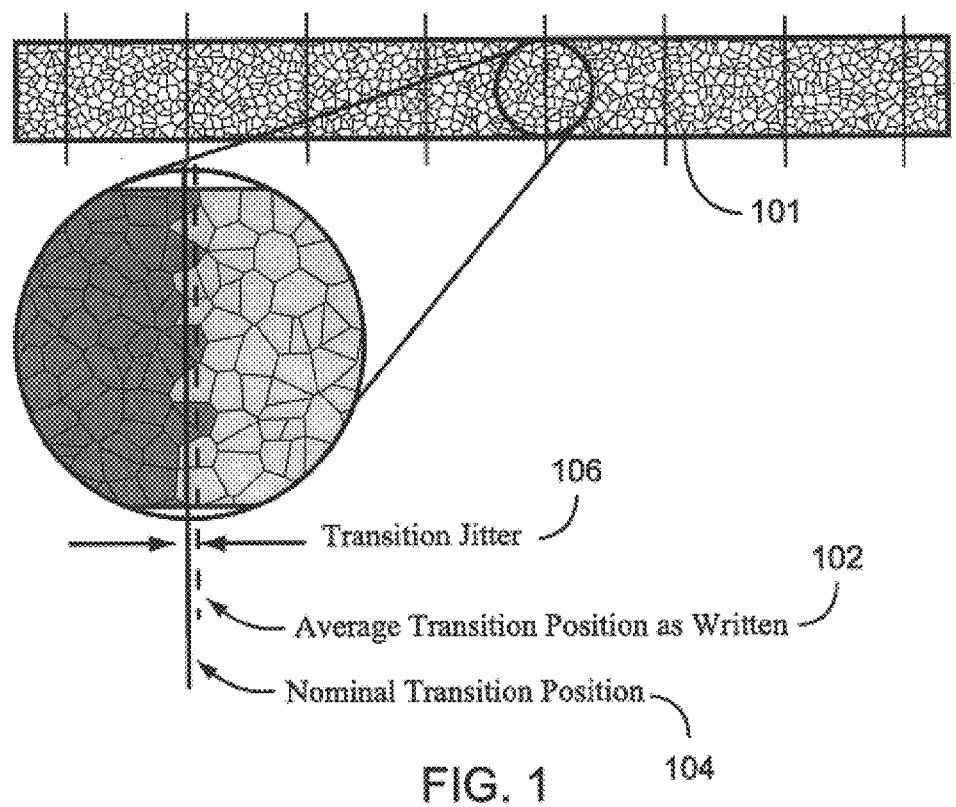
FIG. 1 is an illustration of one source of transition jitter noise in magnetic recording systems and media.
Figure 4:
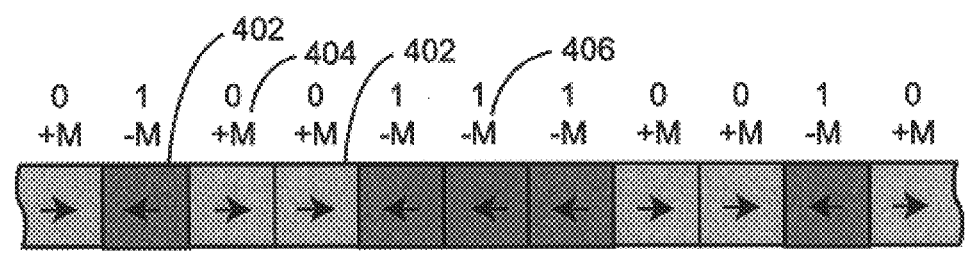
FIG. 4 is an illustration of a conventional interpretation of a magnetic recording system as a pulse amplitude modulation channel and recording system.

The present invention will now be described in detail with reference to a few preferred embodiments thereof and as illustrated in the accompanying drawings. In the following description, numerous specific details are set forth in order to provide a thorough understanding of the present invention. It will be obvious, however, to one skilled in the art, that the present invention may be practiced without some or all of these specific details. In other instances, well known process steps have not been described in detail to avoid obscuring the present invention.

The present invention combines the use of coding and modulation in the spirit of treillis coded modulation, the use of cosets to expand a channel alphabet, partial response maximum likelihood ("PRML") detection and run length limited codes. The present invention has particular application in hard disk drives (the coding scheme would be incorporated into integrated circuits for the recording channel), in optical storage products such as DVD, and in any communications systems where jitter is the dominant source of uncertainty and where the communications medium can only support certain fixed states. The present invention presents the following advantages: treatment of jitter, significantly improved performance over current recording codes, run length constraints which limit transition density and the use of conventional system components.

The preferred embodiments of the invention will be described in the context of magnetic recording, but only for exemplary purposes and in no way limiting application of the present invention to other media, recording schemes or transmission applications. The present invention can be used with various media including, but not limited to longitudinal magnetic recording, perpendicular magnetic recording, magneto-optic recording, phase-change optical recording and read-only optical systems such as CD and DVD. The present invention also may be applicable to certain types of fiber optics systems.

Specifically, the exemplary code presented herein requires that transition times mod 4 be in the code of a 4 state convolutional encoder, excluding adjacent transitions, and can be implemented using a finite state encoder, Viterbi detector and sliding block decoder. Sequences satisfying the exemplary constraint have capacity of approximately 4/9. The system realizes a coding gain of about 3 dB over uncoded recording at the same user density. This gain permits the recording system to store approximately 15–30% more information using the same head and media components.

Briefly, the signaling used in saturation magnetic recording is described as pulse width modulation ("PWM"). A continuous range of magnet lengths are defined between a minimum length (the smallest magnet length that can be written) and a maximum length (the longest magnet that can be read without losing clock synchronization). The recorded magnets are then partitioned into cosets according to the position of the last transition in the magnet. A finite state convolutional encoder can be used to constrain the sequence of magnet cosets.

Instead of using these variable length symbols, however, the code is expressed in terms of a synchronous PAM channel, in which two consecutive transitions define a magnet. Using this expression, a code constraint on transition position is an equivalent constraint on magnet length. By constraining sequences of transitions, most perturbations caused by jitter will not cause an error. An appropriate encoder is created to encode the constrained code. A Viterbi detector, which reflects the code constraints, has states which are the product of the channel states of a conventional PRML detector and the code constraint states. Because of the constraints, only a small subset of all branches are permitted at each resulting trellis update. A conventional sliding block decoder can be used to decode the detected data. In this way, a complete coded recording system can be constructed using standard building blocks of existing PRML channels, namely, a finite state encoder, a Viterbi detector and a sliding block decoder.

The signaling scheme used in saturation magnetic recording is usually characterized as pulse amplitude modulation (PAM). The PAM channel has a constellation of two symbols, corresponding to a single bit cell magnetized in either the up-track or down-track direction.

An alternative and entirely equivalent way to describe the signaling used in saturation magnetic recording is as pulse width modulation (PWM). The PWM channel has a constellation of many symbols, corresponding to magnets of length {B;2B;3B; . . . (k+1)B} where B is the bit length and (k+1) is the maximum magnet length allowed by the modulation code. For PWM, unlike PAM, there is no physical constraint on the size of the constellation. There is a physical limit to the size of the smallest magnet which can be written (though in some systems, such as optical recording systems, the size of the smallest bit can be extremely small) and there are practical problems associated with very long distances between transitions. Between these two limits it is possible to record over a range of magnet lengths, and thus directly adapt constellation expansion and set partitioning to the PWM interpretation of the magnetic recording channel.

Figure 5:
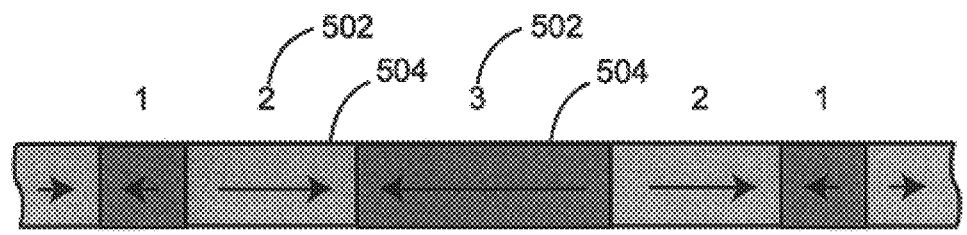
FIG. 5 is an illustration of a conventional interpretation of a magnetic recording system as a pulse width modulation channel and recording system.
Figure 2:
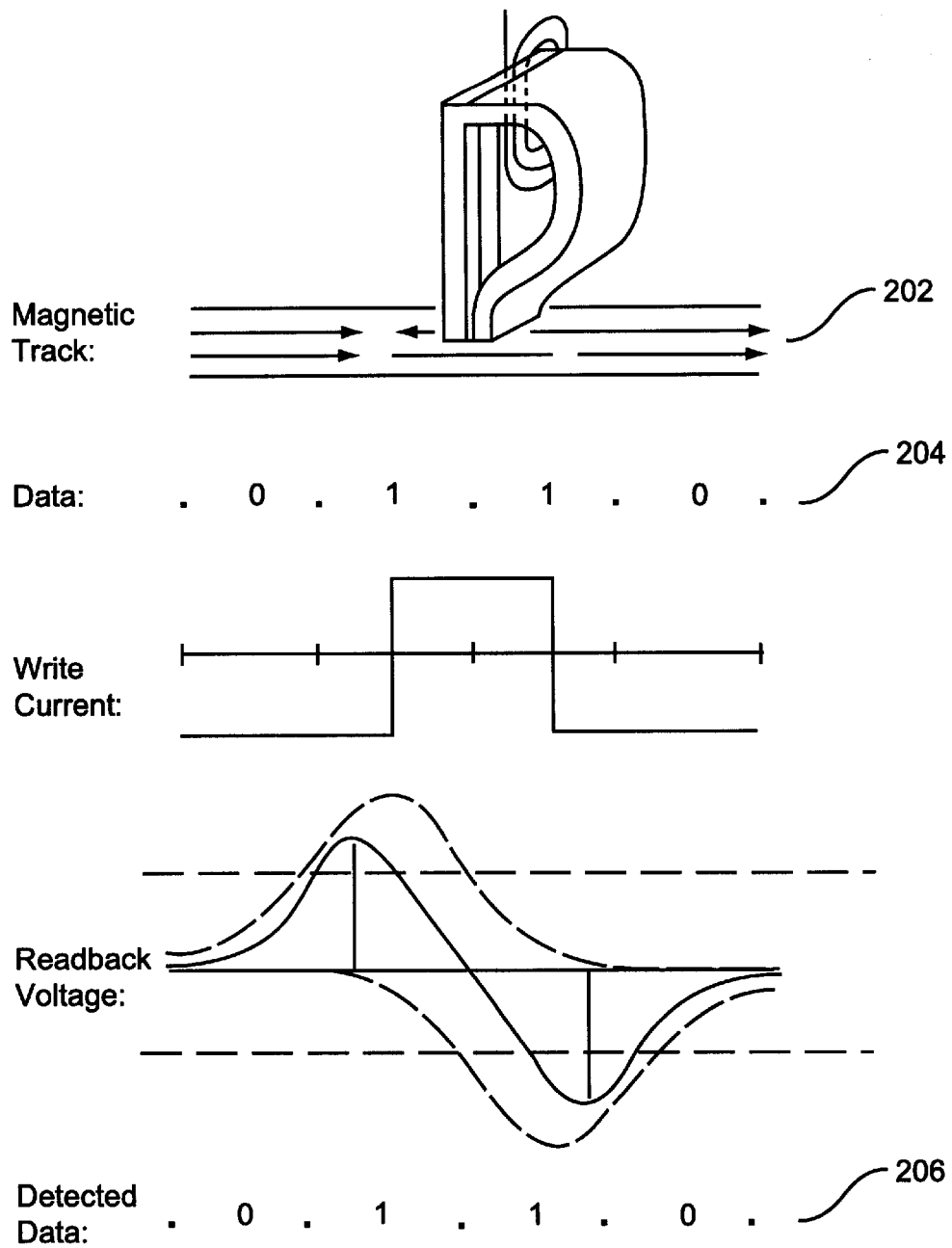
FIG. 2 is a sequential illustration of a magnetic recording channel.
Figure 3:
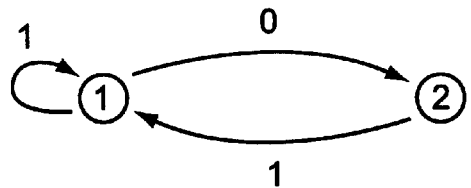
FIG. 3 is an illustrative example of the use of run-length constraints.
Figure 3:
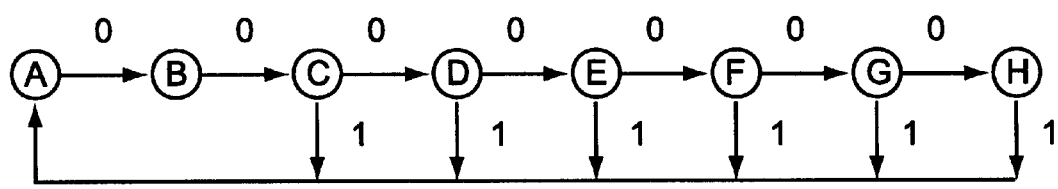

The signaling used in saturation magnetic recording can be considered pulse width modulation (PWM). As shown by example in FIG. 5, the symbol value is recorded as the length 502 of each magnet 504. The position of each transition can be varied easily over a continuous range of values.

This PWM portrayal of recorded data also can be represented in an NRZ scheme as a string of symbols (e.g., 10001100001001110001001010010000101000111111000). Further, such a string of binary 0s and 1s can be represented as the length of runs of each symbol (i.e., 13241233121112141111363). Similarly, a dual channel can be considered in which the channel input is described using a run length representation. The dual channel alphabet is essentially continuous and cosets can be defined in one of several ways.

Typically, cosets are defined by using conventional one dimensional set partitioning on the run lengths. In this manner, N cosets are defined so that runs of (kN+i) symbols are members of coset i. Alternatively, cosets can be defined by considering the time index in which a transition from one channel symbol to another occurs. In this alternative definitional scheme, N cosets are defined so that runs ending at point (kN+i) on the time index are members of coset i.

Figure 6:
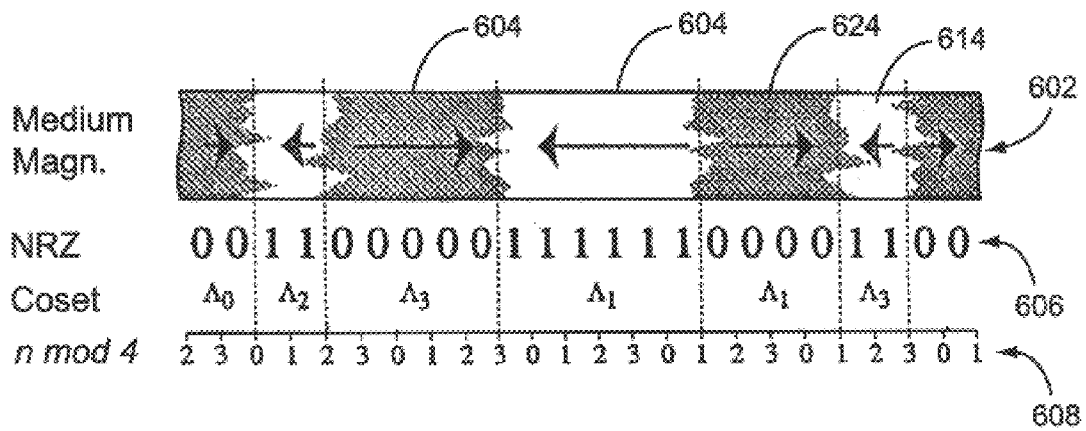
FIG. 6 is an illustrative example of the relationship between physical magnets, constrained NRZ data, and the sequencing of cosets in a preferred embodiment of the present invention.

The goal of the code of the present invention is to ensure a large minimum distance between transition positions in two allowed sequences. By increasing this separation distance, an improvement in immunity to transition jitter can be realized. To construct a code of this type the set of recorded magnets is partitioned according to the position of the last transition in the magnet. Thus a magnet ending at position nB is in coset i where i=n mod 4. This partition scheme is illustrated in FIG. 6. The magnetic medium 602 has a number of recorded magnets 604. The corresponding NRZ encoding establishes a sequence of binary 0 and 1 bits 606. A synchronous time index 608 showing transition times mod 4 establishes membership of a given magnet 604 in a coset $\Lambda_i$, (where i=0, 1, 2 or 3), depending on the termination point of the given magnet 604 along the the index 608. As illustrated in FIG. 6. magnet 614 is a member of coset $\Lambda_3$, while magnet 624 is a member of coset $\Lambda_1$.

Figure 7A:
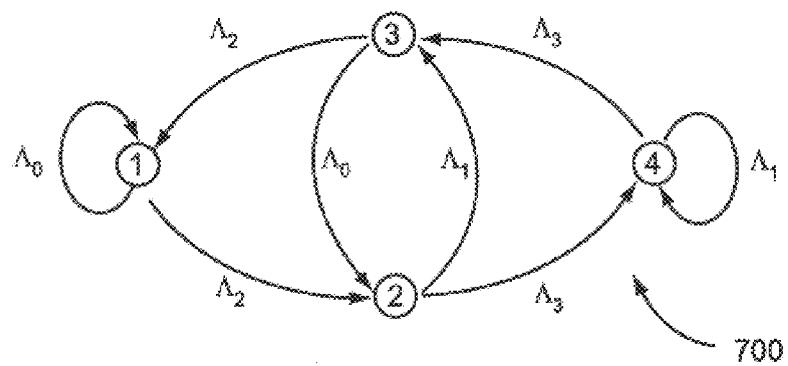
FIG. 7A is a constraint graph in a preferred embodiment of the present invention.

A 4-state constraint graph, shown in FIG. 7A, constrains the sequence of magnet cosets. Each coset contains more than one possible signal. For example, if the last magnet ended with a transition in $\Lambda_2$ and the current magnet must end with a transition in $\Lambda_1$ then the current magnet can have length 3B; 7B; 11B . . . etc. The constraint graph of FIG. 7A can be expressed equivalently in the following tabular form:

| Previous State | Next State | Coset |
| --- | --- | --- |
| 1 | 1 | A0 |
| 1 | 2 | A2 |
| 2 | 3 | A1 |
| 2 | 4 | A3 |
| 3 | 4 | A1 |
| 3 | 3 | A3 |
| 4 | 2 | A0 |
| 4 | 1 | A2 |

Figure 7B:
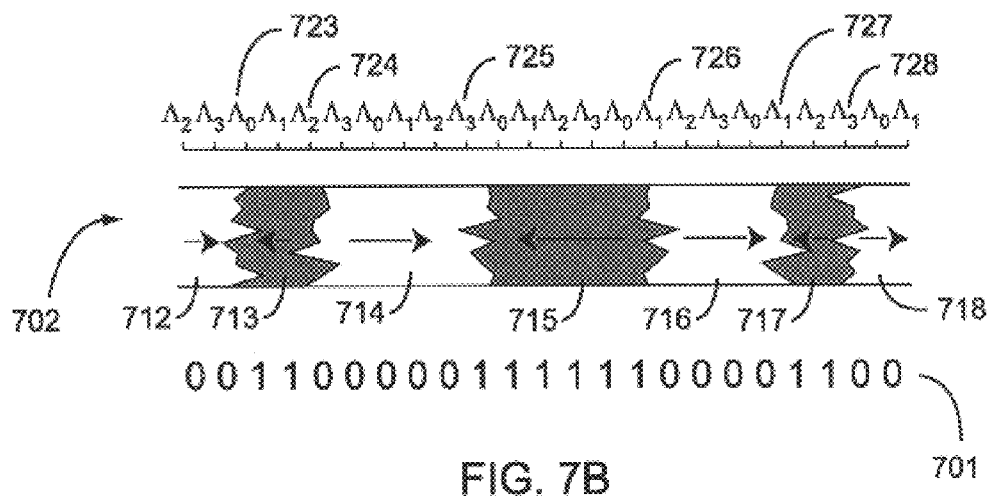
FIG. 7B is an exemplary recording conforming to the constraint graph of FIG. 7B.

In the preferred embodiment, run length constraints of d=1, k=16 are imposed which allow 4 magnets in each coset and permit a minimum magnet length of 2B and a maximum magnet length of 17B. This partitioning of the magnets into four cosets of four magnets each improves the effectiveness of the code over other attempts to utilize only two cosets (which can make the code vulnerable to errors within a given coset). As seen in FIG. 7B, a sample recording 702 contains a number of magnet segments 712–718 and has corresponding NRZ binary data 701. The transition 723 to magnet 713 occurs at $\Lambda_0$ on time index 710. The next transition 724 is to magnet 714 and occurs at $\Lambda_2$. This means, according to the constraint graph of FIG. 7A, that the next transition must occur at either $\Lambda_1$ or $\Lambda_3$. The transition 725 to magnet 715 occurs at $\Lambda_3$. The following three transitions 726, 727, 728, corresponding to magnets 716, 717, 718, respectively, occur at $\Lambda_1$, $\Lambda_1$, $\Lambda_3$, thus complying with constraint graph 700.

Figure 8:
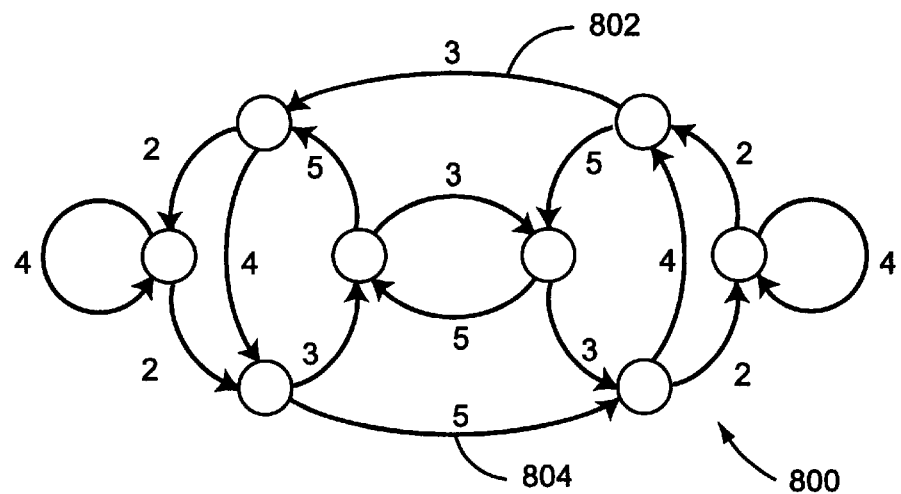
FIG. 8 is an exemplary illustration of a constraint graph showing how a constraint on transition position can be expressed as an equivalent constraint on magnet length.

While it is conceptually useful to consider signaling with a trellis coded PWM, it is difficult to construct a detector which operates on variable length symbols. Instead, in the present invention, the code is expressed in terms of a synchronous PAM channel. Since two successive transitions define a magnet, the code constraint on transition position is expressed as an equivalent constraint on magnet length. The position constraint graph can be expressed as a run length constraint graph. This yields an 8-state encoder 800, shown in FIG. 8. Each coset contains four magnets. In FIG. 8, only the shortest magnet in each coset is shown. For example, an edge 802 labeled 3 represents four parallel edges for magnets of length 3, 7, 11 and 15 in the preferred embodiment. Analogously, an edge 804 labeled 5 represents four parallel edges for magnets of length 5, 9, 13 and 17 in the preferred embodiment.

Figure 9:
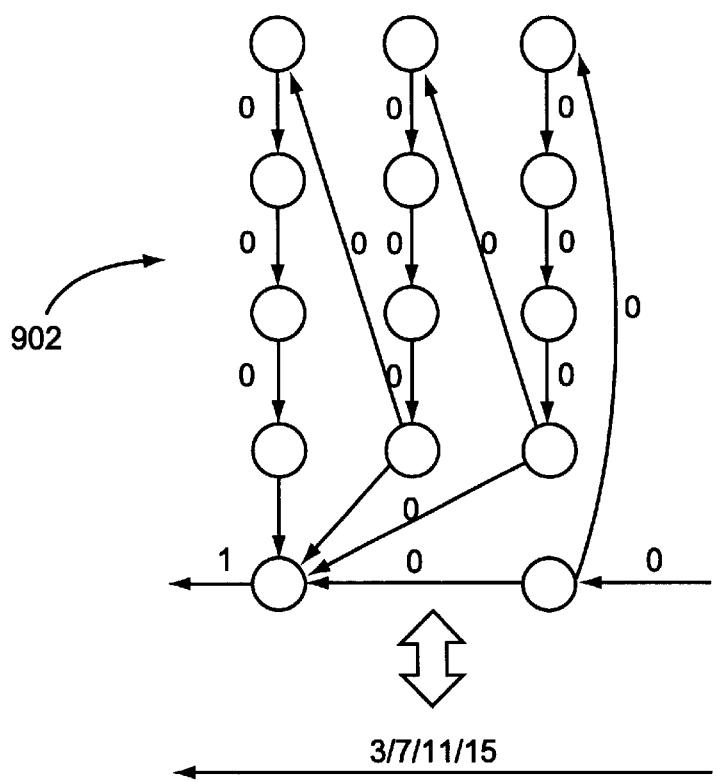
FIG. 9 is an NRZI subgraph showing an equivalent to an edge labeled "3" in the constraint graph of FIG. 8.

The code of the present invention also can be expressed as a constraint on NRZI data, as shown in FIG. 9. Here, each branch of the run length constraint graph of FIG. 8 is represented by an appropriate subgraph. For example, for an edge labeled "3" in FIG. 9, which represents all magnets of lengths 3, 7, 11 and 15, the subgraph would be the same as the subgraph 902 of FIG. 9.

Each magnet is mapped directly to an NRZI binary string, yielding a 132 state NRZI encoder having an adjacency matrix G. A single round of state splitting is applied to G12 in accordance with B. H. Marcus, P. H. Siegel, and J. K. Wolf. "Finite state modulation codes for data storage," IEEE J. Select. Areas Commun., vol. 10, no. 1 1992, which is incorporated herein by reference. This yields a 38 state, rate 5/12 encoder and a 4-block sliding block decoder which achieves 93% of capacity. It is also possible to achieve rate 7/16 (98% of capacity) with a more complex encoder/decoder pair.

Figure 10A:
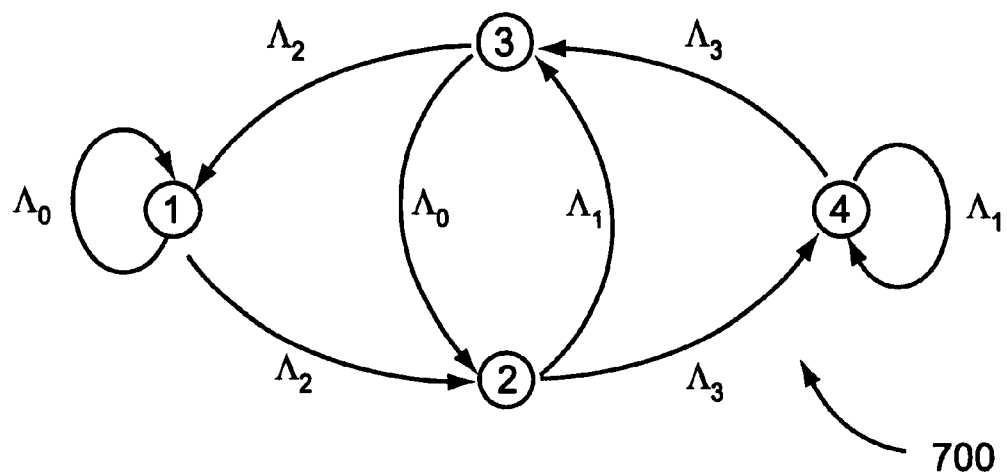
FIG. 10A is a constraint graph to be used as part of the Viterbi detector of the preferred embodiment of the present invention.
Figure 10B:
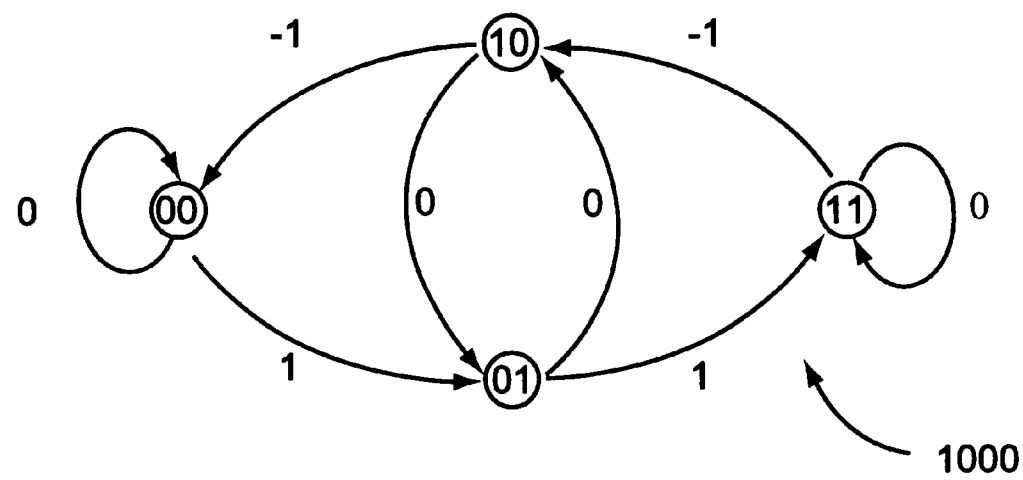
FIG. 10B is a partial response state machine of the Viterbi detector used in the preferred embodiment of the present invention.

Detection is achieved by partial response equalization and maximum likelihood decoding incorporating the constraints of both the coset encoder state machine and the equalized channel response. As will be apparent to one of ordinary skill in the art, a Viterbi detector can be constructed which reflects the code constraints. This detector has states which are the set product of the channel states of a conventional PRML detector and the encoder states. The Viterbi detector must reflect the code constraint graph 700 (FIG. 10A which is the same as FIG. 7A), the partial response state machine 1000 (FIG. 10B) and the d=1 constraint.

Figure 11A:
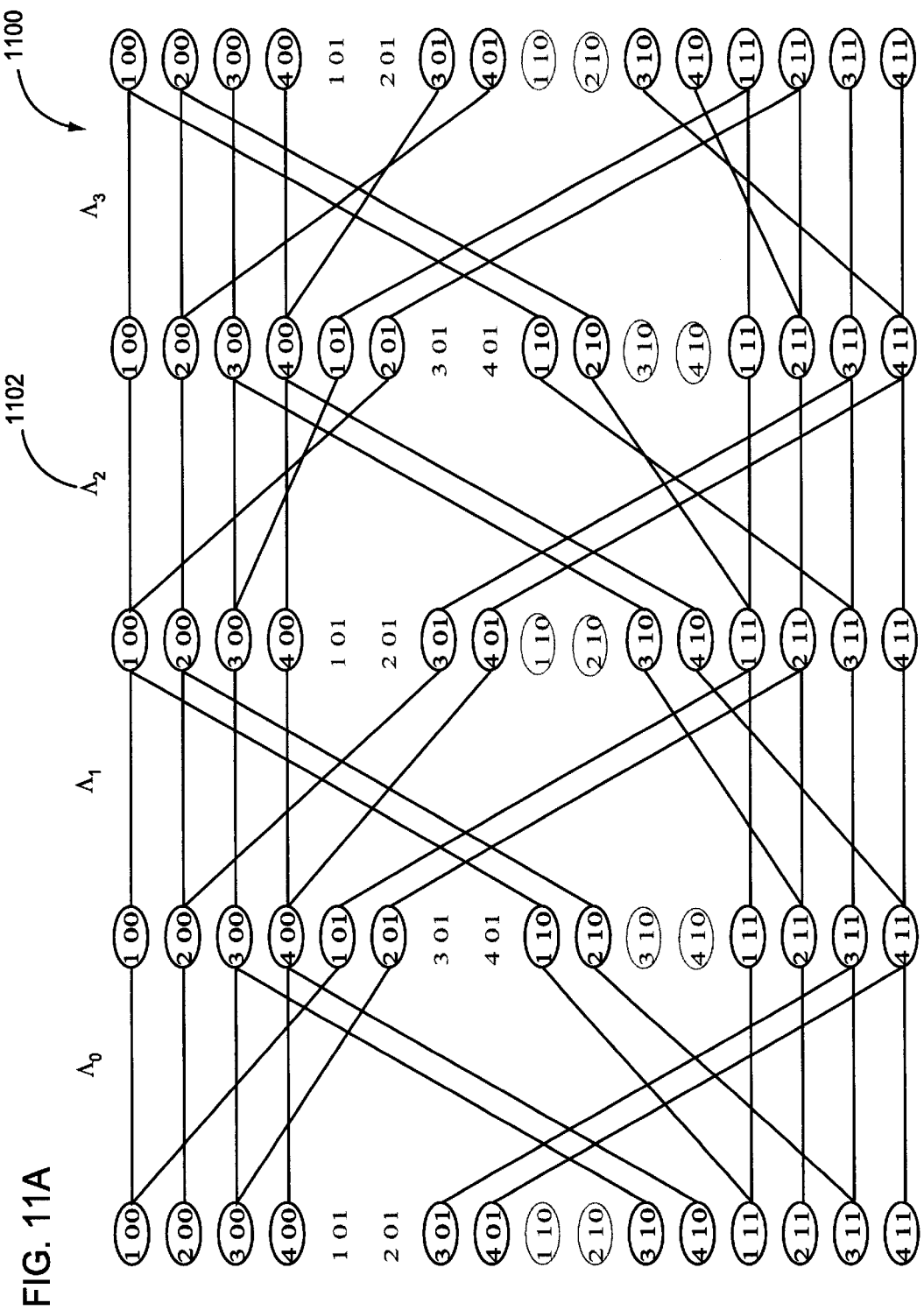
FIG. 11A is a one-step coded PR4 detector trellis for one preferred embodiment of the present invention.

For example, a detector for constrained PR4 has 16 states, as shown in FIG. 11A. The time-varying detector 1100 is cyclic in nature and reflects the cyclic, position-dependent nature of the coset definition. A transition between two encoder states is only permitted at a position corresponding to the appropriate coset. For example a transition on the 642nd channel bit after sync byte corresponds to coset $\Lambda_2$ since 642 mod 4=2. At this $\Lambda_2$ position 1102 of FIG. 11, only transitions between encoder state 3 and encoder state 1 and between encoder state 1 and encoder state 2 are permitted. Because of these constraints, (established by the combination of the code constraint graph 700 and the partial response state machine 1000 of FIGS. 10A and 10B) only a small subset of all branches are permitted at each trellis update. As can be seen in FIG. 11A, for the constrained PR4 detector only 12 branches must be considered at each trellis update. Of these 12 branches there are only four sets of merging paths, the same as for uncoded PR4.

Figure 11B:
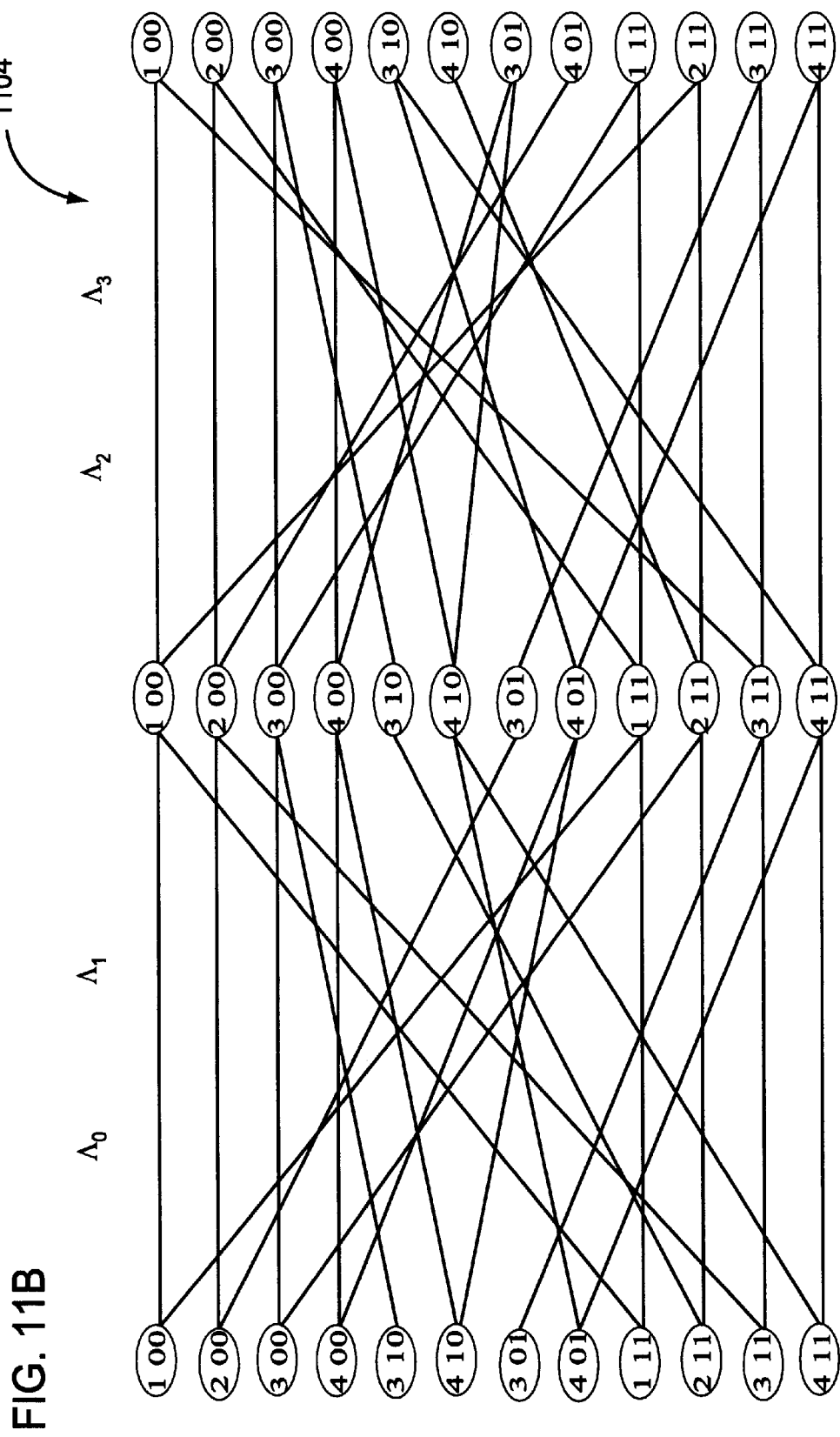
FIG. 11B is a two-step coded PR4 detector trellis for another preferred embodiment of the present invention.

As will be appreciated by one of ordinary skill in the art, the trellis of FIG. 11A call be shown as a 2-step coded trellis 1104, as seen in FIG. 11B. This detector takes two samples per update.

Figures 12, 14:
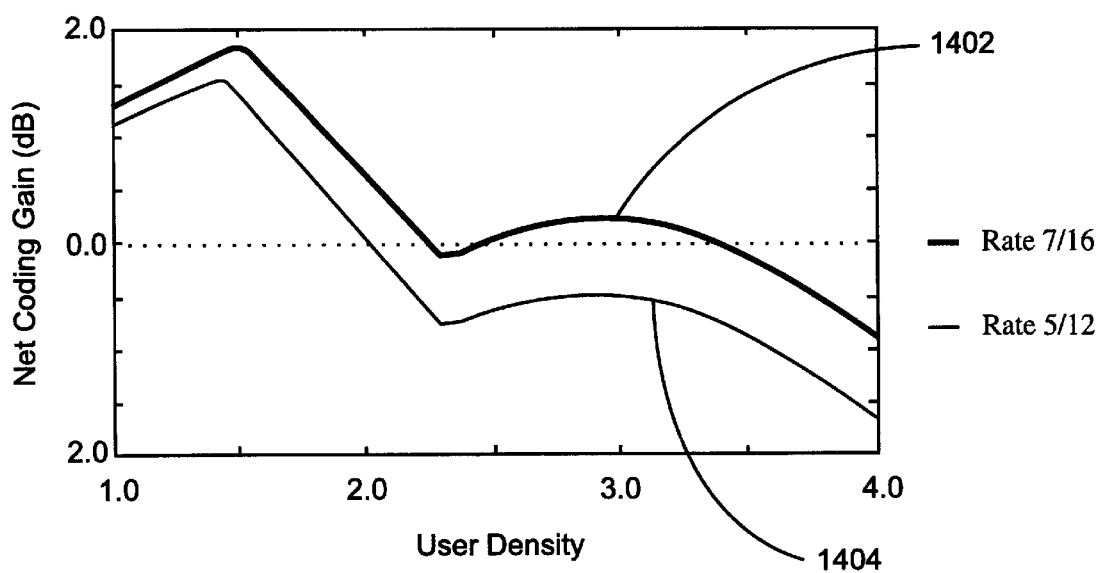
FIG. 12 shows relative complexity for various Viterbi detectors usable with the present invention.
FIG. 14 is a graphical depiction of the expected coding gain (or loss) of the code constraint with respect to additive white Gaussian noise (AWGN).

FIG. 12 shows in tabular form the detector complexity of coded data using the present invention compared to uncoded data. As can be seen from FIG. 12, the Viterbi detector complexity is reasonable. With the coded detection, it will usually be necessary to use a longer target polynomial because of increased channel density.

The original constraint graph has an anticipation of two transitions which is at most 18 channel bits. After a single round of state splitting the encoder thus has an anticipation of no more than 30 channel bits. A sliding block decoder with a window of 36 channel bits (15 user bits) can then be utilized. Thus a complete coded recording system can be constructed using standard building blocks of existing PRML channels.

In calculating coding gain and performance, three distinct classes of error event are considered—jitter errors, distance errors and erasure errors. In all of these classes of events, the code of the present invention provides improved performance over uncoded recording.

Figure 13:
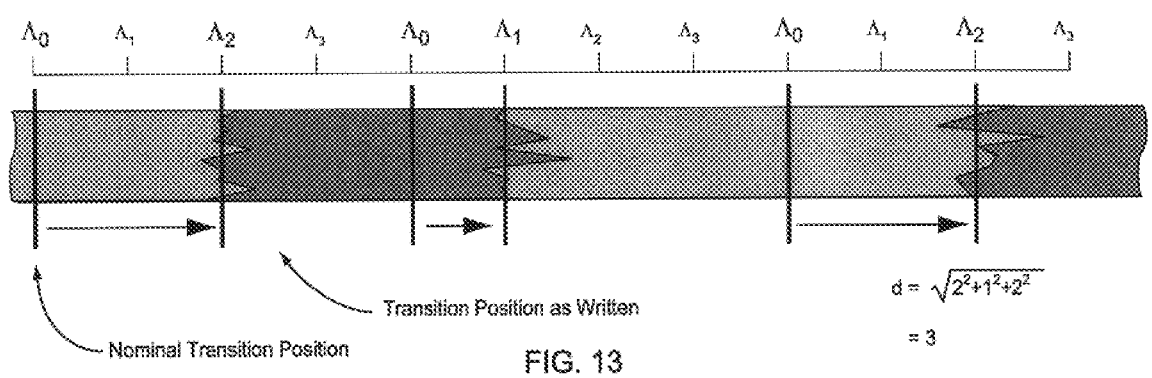
FIG. 13 is an illustrative example of the most likely class of errors caused by transition jitter.

With reference to FIG. 13 for errors due only to transition shift, a minimum distance error requires two transitions to jitter by 2B each and one transition to jitter by B. Thus $d_{min}$=3B. For uncoded recording the minimum distance jitter error requires one transition to shift by B. Thus raw immunity to jitter increases by 9.5 dB. Net immunity to jitter increases by 2.5 dB at a 5/12 code rate and 3.5 dB at the maximum code rate of 4/9.

FIG. 14 illustrates net coding gain as a function of user density. The graph illustrates gains for code rate 7/16 (line 1402) and for code rate 5/12 (line 1404). The minimum Euclidean distance error event for the code on a Lorentzian channel at user density less than 1.5 corresponds to erasure of a length 3 magnet. The minimum Euclidean distance error event for the code on a Lorentzian channel at user density greater than 1.5 corresponds to a NRZ difference sequence of {+1−2+1}. For error due to additive white Gaussian noise (AWGN) the minimum distance error event for a Lorentzian channel is the bit error sequence of ±{1, 1, 1}. For uncoded recording at a channel density of 1.5 the minimum distance error event is the bit error sequence ±1. At this density the raw immunity to AWGN increases by 7 dB. Net immunity to AWGN is a function of user density shown in FIG. 14.

Figure 15:
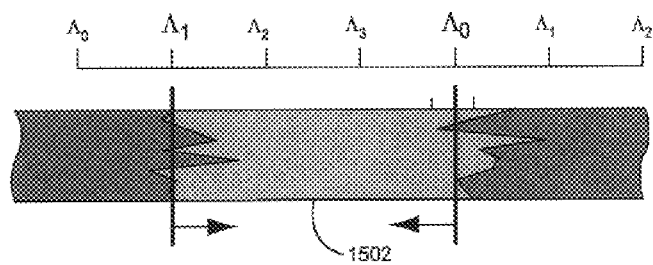
FIG. 15 is an illustrative example of the most likely class of errors caused by partial erasures.

With reference to FIG. 15, for errors due to partial erasure, the smallest magnet 1502 which can be erased to cause an error has length 3B. While the code allows magnets of length 2B no two allowed sequences differ only by a magnet of this length. Vulnerable magnets of length 3B occur with a frequency of approximately 0.03 (compared with 0.5 for uncoded signaling). At a code rate of 5/12, the physical size of the smallest erasable feature increases by 20% compared to uncoded recording (33% at 4/9). The net immunity to partial erasure and correlated jitter increases by a factor of approximately 1.5.

Figure 16:
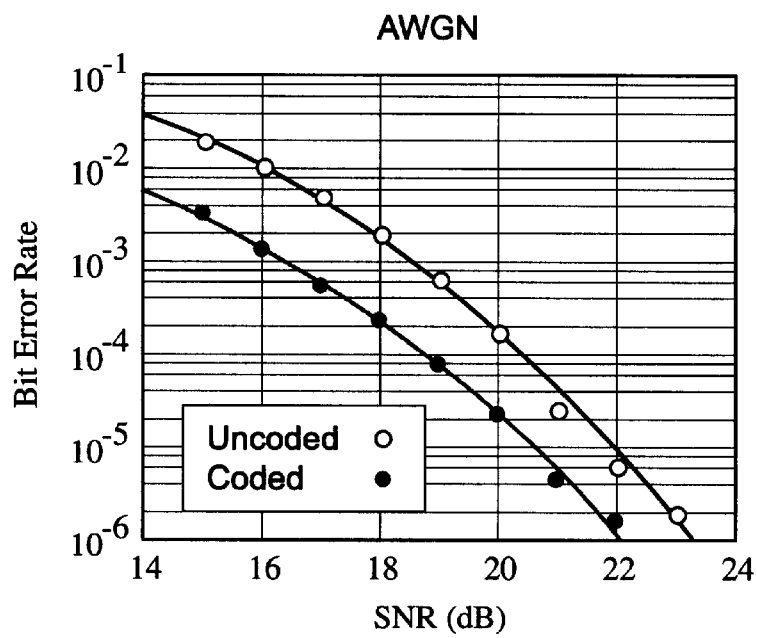
FIG. 16 is a graphical depiction of the results of a simulation of the present invention in the presence of AWGN at user density 1.5 bits/$PW_{50}$.
Figure 17:
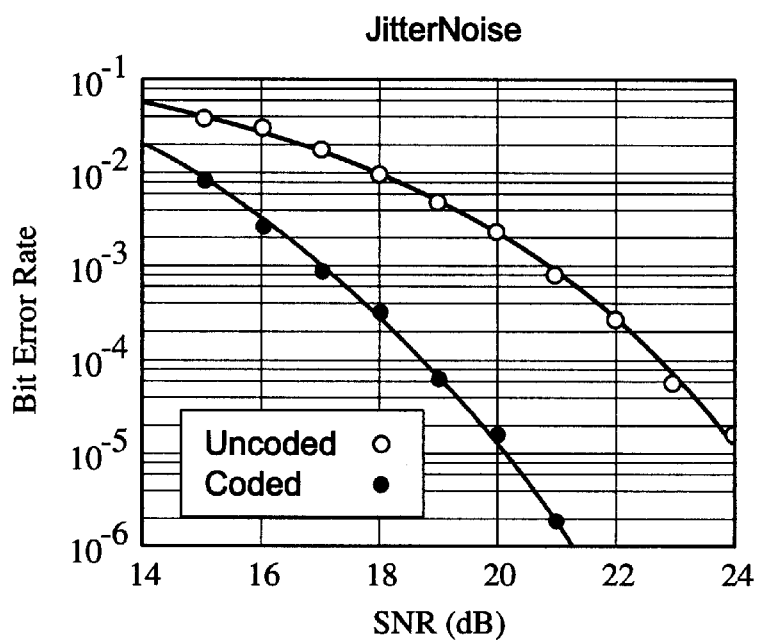
FIG. 17 is a graphical depiction of the results of a simulation of the present invention in the presence of purely jitter at user density 1.5 bits/$PW_{50}$.

A bit-by bit simulation was performed to further investigate net coding gain. The results of this simulation are reflected in FIG. 16 and FIG. 17. Test signals were generated by convolving signed NRZI data with a Lorentzian pulse. For the simulation results shown in FIG. 16, noise was added in the form of AWGN and Gaussian transition jitter.

Figure 18:
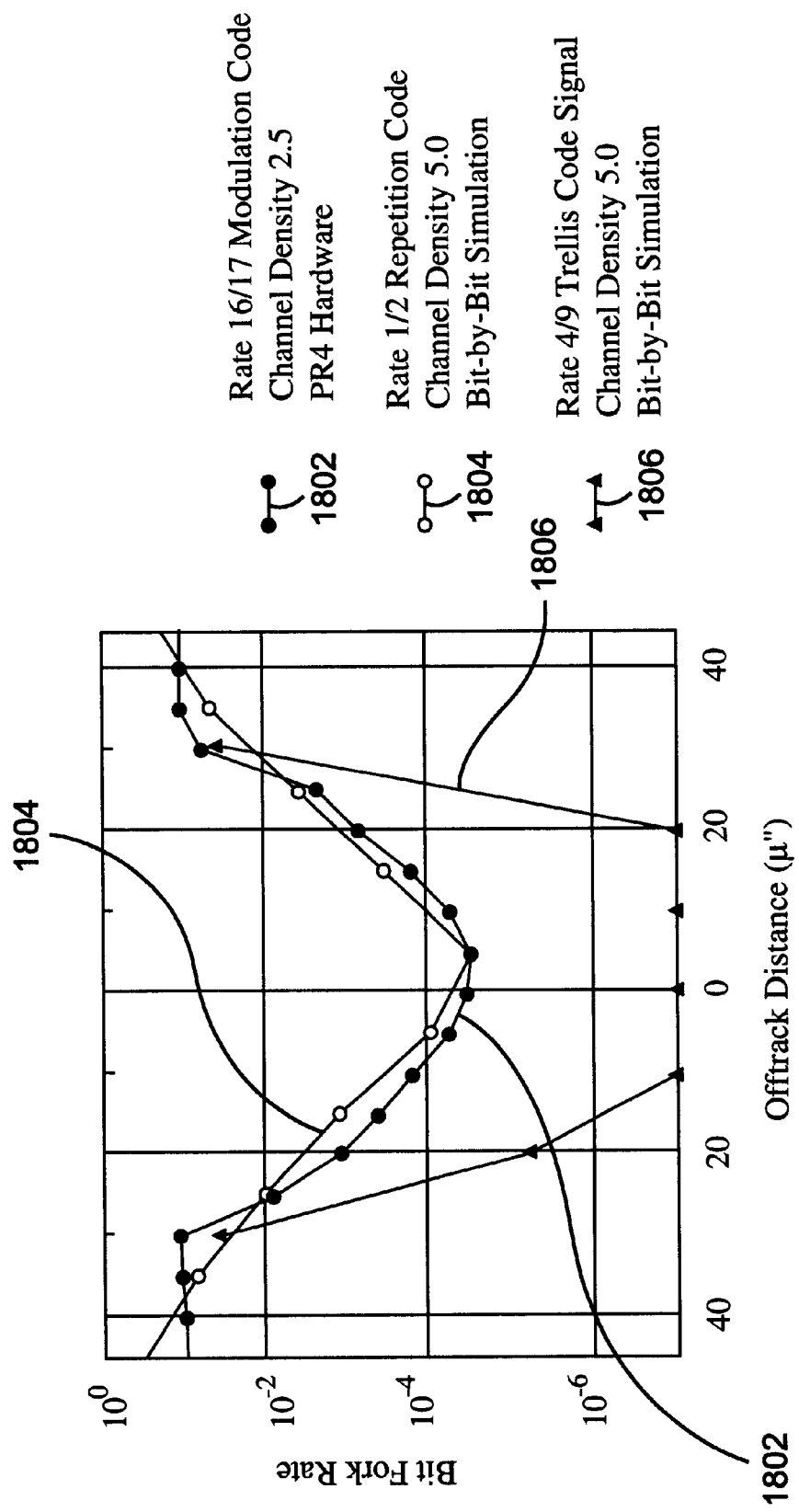
FIG. 18 is a graphical depiction of the results of performance of the present invention using a spin-stand tester at user density 2.5 bits/$PW_{50}$.

Finally, bit-by-bit simulations were performed with captured waveforms. The results are illustrated in FIG. 18. Line 1802 shows the results using a rate 16/17 modulation code, channel density 2.5 and PR4 hardware. Line 1804 shows the results using a rate 1/2 repetition code, channel density 5.0 and bit-by-bit simulation. Line 1806 shows the results using a rate 4/9 trellis coded signal, channel density 5.0 and bit-by-bit simulation. As can be seen, the trellis coded modulation scheme offers a significant improvement.

The code rate which can be achieved using these constraints is approximately one half that of a conventional modulation code. For this reason these codes must be used at twice the channel density of an uncoded system in order to achieve all equivalent user density. Doubling the channel density is analogous to constellation expansion in classical TCM.

There are a number of important channel integration issues related to doubling the channel density. While increasing the channel density will require the use of a longer partial response channel polynomial (and thus a more complex detector), the code constraints eliminate many branches in the trellis and ensure that detector complexity remains tractable. Increased channel density makes timing and gain recovery more challenging.

The use of a run-length constraint ensures that the maximum flux density of the coded channel is no greater than that of an equivalent uncoded channel. No new demands are made of the write head and driver. Also, write nonlinearity and thermal decay should be comparable for coded and uncoded systems.

Doubling the channel density requires a corresponding doubling of the read clock rate. This places greater demands on detector circuits. Because the constrained Viterbi detector is very sparse, it is possible to operate the detector at half the channel rate by considering two samples at a time while maintaining a maximum fan-in of two branches per state.

Most importantly, the present invention can be implemented using standard architecture including a finite state encoder, a Viterbi detector and a sliding block decoder. The code of the present invention reflects the physical nature of media noise by ensuring that it is unlikely that jitter will cause one allowed channel sequence to appear like another allowed channel sequence. The code allows the use of a rich selection of convolutional encoders to achieve the best coding gain for a desired code rate and detector complexity.

As will be appreciated, the code of the present invention offers significant coding gain over uncoded transmission at the same user data rate. It is important to stress user data rate as may coding schemes for magnetic and other recording and/or transmission offer substantial coding gain. Frequently, however, this coding gain disappears when the recording or transmission density is increased to compensate for the code rate.

The present invention encompasses a broad range of encoder/decoder structures and combinations. It extend easily to different channel alphabets, run-length constraints and partial response polynomials. The present invention also is completely compatible with advanced partial-response detectors such as NPML and turbo PRML. As such, many of the features of the preferred embodiment can be varied, while still remaining within the scope and spirit of the invention as disclosed and claimed. For example, the rate and complexity of the convolutional encoder may be varied to select the coset sequence. The number and labeling of cosets can be changed (two labeling schemes are transition position cosets and transition spacing cosets). The run length constraints which limit the minimum and maximum distance between transitions imposed on the system could be varied. When a run length constraint is used, merges do not occur in the same detector state on successive intervals. Therefore, it is possible to pipeline the detector trellis and operate all ACS blocks at half the channel clock rate. The length and shape of the partial response equalization target also can be varied.

Finally, the present invention also can be implemented as a two-state detector in which a PRML or reduced-state detector estimates the position of transitions and a trellis decoder estimates the most likely data sequence giving rise to the transition positions. This implementation is likely to perform less well than the integrated decoder but may be simpler to implement for long PR targets and complex encoders. This implementation also would allow the detector to operate a synchronously.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for encoding data, comprising:

providing a set of run length defined symbols $(d+1)B$, $(d+2)B$, . . . $(k+1)B$, where said symbols are integer multiples of a unitary bit length B;

imposing run-length constraints on said set of symbols where $(d+1)B$ is the shortest symbol permitted and $(k+1)B$ is the longest symbol permitted;

partitioning said set of symbols into cosets wherein a symbol ending at a transition position nB is in coset Ai where i=n mod j;

constraining the sequence of symbol cosets.

2. The method of claim 1 further comprising the step of using a detector that reflects said sequence constraints for detecting said coded symbols.

3. The method of claim 2 wherein said detector is a Viterbi detector.

4. The method of claim 3 further comprising the step of decoding the coded symbols using a sliding block decoder.

5. The method of claim 4 wherein said method is used for magnetically recording coded data on storage media.

6. The method of claim 5 wherein d=1, k=16 and j=4.

7. The method of claim 1 wherein said method is used for magnetically recording coded data on storage media.

8. The method of claim 7, wherein d=1, k=16 and j=4.

9. The method of claim 1 wherein d=1, k=16 and j=4.

10. The method of claim 1 wherein said method is used for optically recording coded data on storage media.

11. A method for encoding data, comprising:

providing a set of run length defined symbols $(d+1)B$, $(d+2)B$, . . . $(k+1)B$, where said symbols are integer multiples of a unitary bit length B;

imposing run-length constraints on said set of symbols where (d+1)B is the shortest symbol permitted and (k+1)B is the longest symbol permitted;

partitioning said set of symbols into cosets wherein a symbol having a length nB is in coset $\Lambda_i$ where i=n mod j;

constraining the sequence of symbol cosets.

12. The method of claim 11 further comprising the step of using a detector that reflects said sequence constraints for detecting said coded symbols.

13. The method of claim 12 wherein said detector is a Viterbi detector.

14. The method of claim 13 further comprising the step of decoding the coded symbols using a sliding block decoder.

15. The method of claim 14 wherein said method is used for magnetically recording coded data on storage media.

16. The method of claim 15 wherein d=1, k=16 and j=4.

17. The method of claim 11 wherein said method is used for magnetically recording coded data on storage media.

18. The method of claim 17 wherein d=1, k=16 and j=4.

19. The method of claim 11 wherein d=1, k=16 and j=4.

20. The method of claim 11 wherein said method is used for optically recording coded data on storage media.

21. A method for encoding data, comprising:

providing a set of run length defined symbols 2B, 3B, 4B, . . . (k+1)B, where said symbols are integer multiples of a unitary bit length B;

imposing run-length constraints on said set of symbols where 2B is the shortest symbol permitted and (k+1)B is the longest symbol permitted;

partitioning said set of symbols into cosets wherein a symbol ending at a transition position nB is in coset $\Lambda_i$ where i=n mod j and further wherein j is a power of 2;

constraining the sequence of symbol cosets using a finite state convolutional encoder.

22. The method of claim 21 further comprising the step of using a detector that reflects said sequence constraints for detecting said coded symbols.

23. The method of claim 22 wherein said detector is a Viterbi detector which reflects the code constraints and has states which are the product of the states of the following constraint table:

| Previous State | Next State | Coset |
|---|---|---|
| 1 | 1 | A0 |
| 1 | 2 | A2 |
| 2 | 3 | A1 |
| 2 | 4 | A3 |
| 3 | 4 | A1 |
| 3 | 3 | A3 |
| 4 | 2 | A0 |
| 4 | 1 | A2 | and the channel states of a conventional PRML detector.

24. The method of claim 23 further comprising the step of decoding the coded symbols using a sliding block decoder.

25. The method of claim 24 wherein said method is used for magnetically recording coded data on storage media.

26. The method of claim 25 wherein k=16 and j=4.

27. The method of claim 21 wherein said method is used for magnetically recording coded data on storage media.

28. The method of claim 27 wherein k=16 and j=4.

29. The method of claim 21 wherein k=16 and j=4.

30. The method of claim 21 wherein said method is used for optically recording coded data on storage media.

31. A method for encoding data, comprising:

providing a set of run length defined symbols 2B, 3B, 4B, . . . (k+1)B, where said symbols are integer multiples of a unitary bit length B;

imposing run-length constraints on said set of symbols where 2B is the shortest symbol permitted and (k+1)B is the longest symbol permitted;

partitioning said set of symbols into cosets wherein a symbol having a length nB is in coset $\Lambda_i$ where i=n mod j and further wherein j is a power of 2;

constraining the sequence of symbol cosets using a finite state convolutional encoder.

32. The method of claim 31 further comprising the step of using a detector that reflects said sequence constraints for detecting said coded symbols.

33. The method of claim 32 wherein said detector is a Viterbi detector which reflects the code constraints and has states which are the product of the states of the following constraint table:

| Previous State | Next State | Coset |
|---|---|---|
| 1 | 1 | A0 |
| 1 | 2 | A2 |
| 2 | 3 | A1 |
| 2 | 4 | A3 |
| 3 | 4 | A1 |
| 3 | 3 | A3 |
| 4 | 2 | A0 |
| 4 | 1 | A2 | and the channel states of a conventional PRML detector.

34. The method of claim 33 further comprising the step of decoding the coded symbol using a sliding block decoder.

35. The method of claim 34 wherein said method is used for magnetically recording coded data on storage media.

36. The method of claim 35 wherein k=16 and j=4.

37. The method of claim 31 wherein said method is used for magnetically recording coded data on storage media.

38. The method of claim 37 wherein k=16 and j=4.

39. The method of claim 31 wherein k=16 and j=4.

40. The method of claim 31 wherein said method is used for optically recording coded data on storage media.

* * * * *